United States Patent [19]

George

[11] Patent Number: 4,652,776
[45] Date of Patent: Mar. 24, 1987

[54] CIRCUIT USING A MULTI-PATH MAGNETIC CORE WITH COMMON OUTPUT LIMB

[75] Inventor: Terence M. George, Wiltshire, England

[73] Assignee: Westinghouse Brake & Signal Company Limited, Chippenham, England

[21] Appl. No.: 721,733

[22] Filed: Apr. 10, 1985

[30] Foreign Application Priority Data

Apr. 12, 1984 [GB] United Kingdom ................. 8409551

[51] Int. Cl.[4] ............................................. H03K 17/81
[52] U.S. Cl. .................................... 307/407; 307/411; 323/250; 323/251; 323/302
[58] Field of Search ................. 307/43, 282, 407, 411, 307/44, 419, 412; 323/215, 250, 251, 301, 302, 303, 305, 331, 332, 334, 355, 358, 359, 362; 246/26, 98, 131, 132

[56] References Cited

U.S. PATENT DOCUMENTS 2,554,203  5/1951  Morgan .............................. 323/302
2,685,653  8/1954  Orr et al. ......................... 307/409 X
2,868,451  1/1959  Bauer .............................. 307/408 X
2,978,176  4/1961  Lockhart ......................... 307/408 X
3,015,039  12/1961 Morgan ................................. 307/419
3,373,347  3/1968  Maka ................................... 323/250
4,419,648  12/1983 Seipel .............................. 323/250 X

FOREIGN PATENT DOCUMENTS 0623661  5/1949  United Kingdom ................ 323/250

Primary Examiner—William M. Shoop, Jr.
Assistant Examiner—Bentsu Ro
Attorney, Agent, or Firm—Nilsson, Robbins, Dalgarn, Berliner, Carson & Wurst

[57] ABSTRACT

An AND function gating circuit for A.C. signals comprising several magnetic circuits around a common limb, each circuit having a separate input winding and a single output winding on the common limb. The magnetic flux level in the common limb is greatly increased when all input windings are simultaneously energized by A.C. signals of the same frequency and in phase relative to the output achieved under other input signal conditions.

15 Claims, 4 Drawing Figures

CIRCUIT USING A MULTI-PATH MAGNETIC CORE WITH COMMON OUTPUT LIMB

The invention relates to an A.C. "AND" Gate, and particularly to such a gate useful for combining the outputs of parallel redundant channels or circuits in a fail-safe manner.

According to the invention there is provided a circuit for performing a logical AND function of A.C. signals comprising a plurality of magnetic circuits disposed around a common limb, a first signal winding inductively coupled with the common limb and inductively coupled with each magnetic circuit one of a plurality of further signal windings such that an output induced in the first winding by flux through said common limb is significantly greater, relative to other conditions, when all said further windings are energised simultaneously by A.C. signals substantially in phase and of the same sense.

Preferably the common limb has an air-gap or the like providing said limb with reluctance value greater than the value of the remainder of the magnetic circuits to increase the ratio of output in the first winding.

In one form of the invention the magnetic circuit comprises a central common limb and a plurality of further parallel limbs connected with the common limb by end sections disposed at angular intervals around the central limb.

The invention and how it may be employed will now be described, by way of example, with reference to the accompanying drawings, in which.

Figure 1:
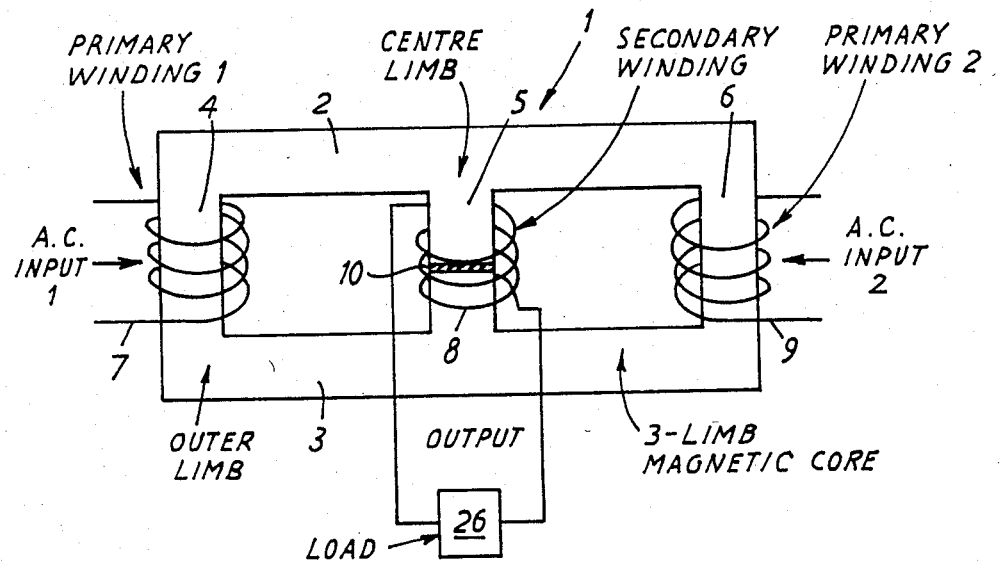
FIG. 1 illustrates the basic form of a transformer AND gate.

Referring now to FIG. 1, there is shown in the drawing the basic "AND" gate according to the invention. A magnetic circuit indicated at 1 consists of core of magnetically susceptible material constructed in the general configuration of a figure of eight, having two end sections 2, 3 and three cross limbs 4, 5 and 6 forming a magnetic circuit with two apertures. The cross limbs 4, 5 and 6 carry multi-turn electrical windings 7, 8, 9 respectively.

For an understanding of the operation of the device consider the effect of an alternating signal connected to winding 7 carried by the outer short limb 4. The flux produced thereby is conducted around the flux path of the magnetic circuit by the laminated core 1, at the junction the flux divides between a shorter path through limb 5, carrying the winding 8, and a longer path through limb 6 which carries winding 9. The proportion of flux in each path is governed by several factors, firstly, by the reluctance of the centre limb and the influence of the load impedance; also the centre limb may have a reduced cross-section to increase its inherent reluctance, and alternatively, or even additionally an air gap may be provided in the centre limb, e.g. by means of a layer 10 of non-magnetic material. As a result the paths, one through the centre limb and the other through the peripheral limbs, will share the total flux according to the ratio of the path reluctances, in a typical example of a single circuit as described this ratio of the change in flux density of the centre limb is in the division of aproximately 1:4 at least and preferably is greater.

In the case where winding 9, carried by the opposite outer limb 6, is connected to an alternating signal source, a corresponding flux path is established in which roughly one quarter of the total flux is conducted through each of the centre limb 5 and three quarters through the outer limb 4.

Consider now the situation when both the windings 7 and 9 carry alternating signals of substantially similar amplitude, of the same frequency, substantially in phase and in the same sense. Two flux paths are established in the magnetic circuit and, assuming the windings to be appropriately sensed, of opposite circularity. Instead of the division of flux in each path at the junction with the centre limb 5, the combined effect of two opposing flux paths is to force both flux paths through the centre limb of the magnetic circuit, the result being to increase the flux density in the centre limb by a substantial factor when input signals are present on both windings relative to the density level present when only one winding is energised.

Generally, full output is delivered to a load connected to winding 8 when two A.C. inputs are present on the windings 7 and 9 and a greatly reduced output when either of the A.C. inputs is absent.

Thus, subject to a load connected to the output winding 8 having a suitably arranged threshold or level discriminating function, the magnetic circuit may be used to produce an "AND" gating function for A.C. signals connected to the windings 7 and 9.

In a preferred construction of the magnetic circuit of the device of FIG. 1, the circuit comprises two symmetrical halves each of which consists of three sets of "C" core laminations, two smaller sets in which the dimension of the open part of the "C" is equal to the required limb spacing and a larger set in which the corresponding dimension embraces both the smaller sets. The two halves of the circuit abut one against the other in the assembled device and are held firmly in postion by means of circumferential banding, as is well known in the field.

An embodiment of the invention will now be described with reference to FIGS. 2 and 3 of the accompanying drawings. The illustrated arrangement forms part of a computer based railway signal interlocking system, and it is particularly concerned with fault detection in the control signal output stage.

Figure 2:
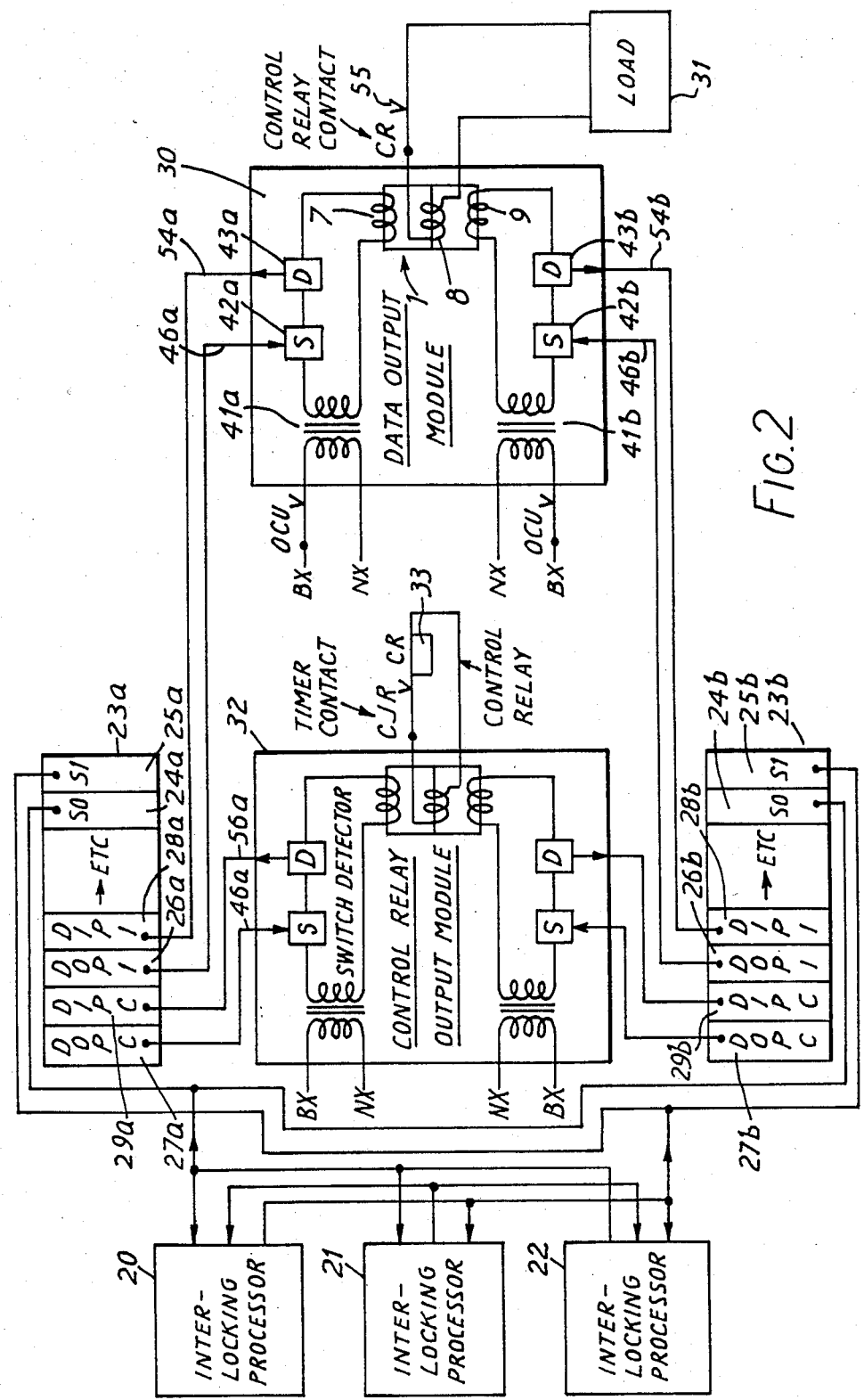
FIG. 2 shows, in block diagram form, an output stage employing the invention for a parallel redundant control system.
Figure 3:
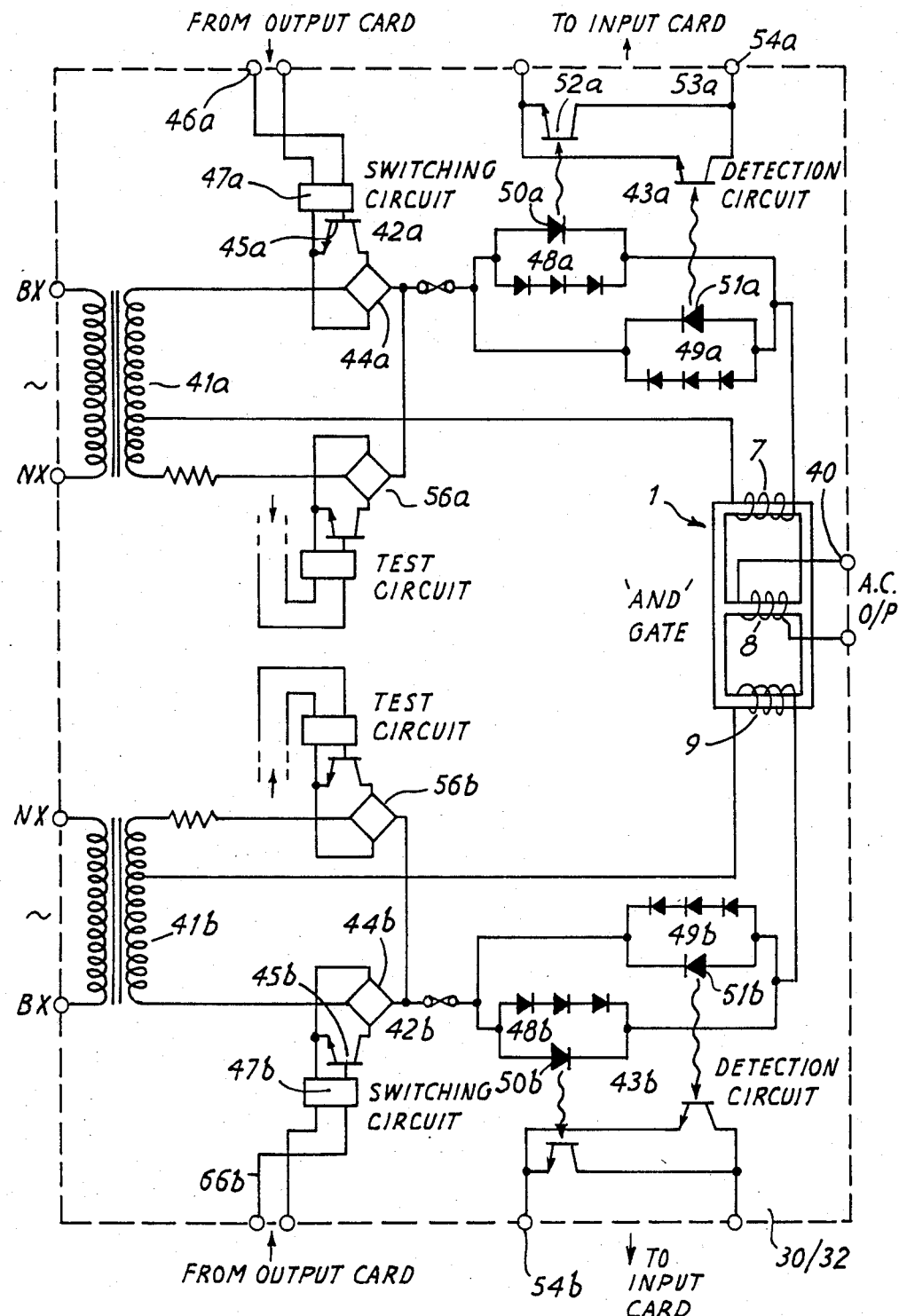
FIG. 3 shows part of the output stage of FIG. 2 in more detail.

Referring firstly to FIG. 2 the interlocking system comprises three parallel interlocking processors 20, 21 and 22 which operate to produce serial control signal outputs in parallel. These outputs comprise serially multiplexed signals consisting, in respect of each control, an address portion and a data or information portion. In the particular system being described, the output of processor 20 is nominated as the preferred system output, the processor 22 is designated as a "hot standby" and is used to provide the system output in the event that processor 20 has developed a fault and its output is disqualified, and processor 21 is used purely in a checking procedure. The processors are interconnected by a data highway and exchange their outputs for the purpose of determining, by majority voting, if the output of processor 20 is a correct signal. The resulting interlocking system serial outputs are distributed to the controlled devices in the railway system by means of demultiplexing circuits in the housings 23a and 23b. These housings are identical in construction and in the circuits each contains, although identity is not essential. In the following description like parts are given like references individually identified by the suffixes "a" and "b". Corresponding demultiplexed outputs are combined or correlated by means of an AND gate of the present invention, the output winding of which is connected to control, by the signal it produces, one device. There is, therefore, for each device one AND gate connected to receive two corresponding demultiplexed control signals which operate switches 42a, 42b to pass A.C. signals which must correspond in frequency substantially in phase and of sufficient amplitude if the device is to be operated to a predetermined state.

In the housings 23a and 23b the output of processor 20 is received by circuit by 24a and 24b respectively and the output of processor 22 is connected to similar circuits 25a and 25b which are arranged to connect the selected processor output for distribution to the control devices in the railway system. The selected serial output is circulated on a data highway in the housing to a multiplicity of data output cards which are divided into two types: 26a and 26b providing a data output "information" signal and 27a and 27b for providing a data output "control" output. The housing 23a and 23b also include a multiplicity of data input cards for "information" signals 28a and 28b, and for "control" signals 29a and 29b, these latter cards receive feed-back signals which will be further described below. Corresponding pairs of cards in the housings 23a and 23b which concern "information" are connected to modules 30 including a transformer AND gate of the present invention, and which provides an output signal to a controlled device represented by a load 31 in the drawing. Corresponding pairs of "control" cards in the housings 23a and 23b are similarly connected with further modules 32, also including a transformer and AND gate of the present invention and which provide an output energising a control relay 33. This control relay 33 has a pair of closed-when-energised contacts connected in series with the output circuit of modules 30. The purpose of this will be further described below.

The circuits of modules 30 and 32 in FIG. 2 are identical and shown in greater detail in FIG. 3, to which reference will now be made. In the AND gate modules there is a transformer AND gate, of the type shown in FIG. 1, indicated by reference 1, this has an output winding 8 connected via output terminals 40 with a remote load 31. The input windings 7 and 9 are connected in respective identical A.C. circuits which will now be described. These circuits are identical the references of individual components will be appropriately identified by suffixes "a" and "b". Each of the A.C. circuits comprises the secondary winding of a transformer 41a and 41b a current switching circuit 42a, 42b and current detection circuit 43a and 43b all adapted for full wave operation and connected in a closed loop with windings 7 and 9.

The switching circuits 42a, 42b include bridge type rectifier arrangements 44a, 44b in which a first pair of diagonal bridge nodes are connected with adjacent circuit components and a current switching transistor 45a, 45b connected between the opposite nodes to provide a selectively controlled current path which may be switched by means of a signal on lines 46a, 46b applied to transistor base drive circuits 47a, 47b respectively.

The signal lines 46a, 46b are connected to data output circuits in the housing 23a, 23b, in the module 30 these are connected to the "information" circuits 26a, 26b, and in the control module 32 these are connected to the control circuits 27a, 27b.

The transformer secondary windings 41a, 41b may form part of separate supply transformers or be supplied by a common primary transformer winding, either being acceptable since correct operation of the transformer AND gate 1 requires the supply to windings 7 and 9 of the same frequency and in phase.

In series with the switching circuits 42a, 42b there is also provided, as mentioned, similar current detection arrangements 43a, 43b comprising two anti-parallel half-wave diode circuits 48a, 48b, 49a, 49b; each consisting of a plurality of rectifier diodes connected in series, the combination being connected in parallel with light emitting diodes 50a, 50b, 51a, 51b. The light emitting diodes 50a and 51a are paired with light sensitive transistors 52a and 53a respectively which are connected in parallel to provide a feed-back signal at terminals 54a which are connected back to data input circuits "information" 28a or "control" 29a from modules 30 and 32 respectively. Similarly feed-back signals are provided at terminals 54b to corresponding circuits in the housing 23b.

Referring again to FIG. 3 there are also provided test circuits generally indicated at 56a, 56b which are constructed and function in identical manner to switching circuits 42a, 42b but receive an attenuated supply voltage from transformer secondary windings 41a, 41b respectively. The transistor based circuits of these test circuits 56a, 56b receive operating pulses from the housings 23a, 23b for the purpose of periodically injecting a test signal into the transformer magnetic circuit, which because of the attenuation of the A.C. supply is insufficient to fully energise windings of 7 and 9 and thereby produce sufficient output at terminals 40 to clear the threshold discriminating level of load 31. Nevertheless this subliminal testing of the transformer magnetic circuit is sensed by the optical detection circuits and feed-back signals pass via terminals 54a, 54b to the housings 23a, 23b for correlation with the original test pulses to ensure that the detection and control gate circuits remain fully operational.

In operation of the system, and assuming there is no fault present, identical control signals will appear at terminals 46a, 46b thus switching transistors 45a, 45b into conduction permitting A.C. current to flow through windings 7 and 9. Being driven from the same A.C. supply these signals are of the same frequency and in phase, and in the absence of fault, also of similar amplitude, therefore output winding 8 will be energised and an output signal will appear at terminals 40 being supplied to the load 31, providing contacts 55 of control relay are closed. Under identical signal conditions, described above, the module 32 behaves in exactly the same manner as module 30 and the output winding 8 of its transformer AND gate provides a current at its output to energise the coil of control relay 33 enabling the contacts 55 to close. The relay 33 is connected in series with a delay timing circuit having a relatively short delay but which is sufficient to accommodate discrepancy between the output signals provided by housing 23a and 23b under initial power-on conditions. Thus, there is a short delay following initial power-on before output signal will appear. The period of the timer is sufficent to allow the system to establish the absence of faults before permitting connection of the system output to the controlled devices.

The circuits 28a and 29a in housing 23a, and also circuits 28b and 29b in housing 23b act as interfaces between 24a ad 25a and 24b and 25b which, correlate the feed-back signals received from the modules 30, 32 respectively with the output signals provided by circuits 26a, 27a and 26b, 27b thereby ensuring that the control and detection circuits are functioning correctly, during both normal control operation and subliminal test phases.

In the event that housings 23a and 23b do not produce signals to transformer AND gate module 30 of substantially identical amplitude the output level of the control signal from winding 8 will be reduced, and at some level of imbalance, will fall below the threshold level of the load 31. The AND gate magnetic circuit may be designed, e.g. by inclusion of an air-gap in the central limb, to have a high to low level ratio of say 12:1. Thus a fault in the demultiplexing or output circuits is quickly detected by circuits 24 and 25 via light emitting diodes detectors and circuits 28a or 28b at the control relay is de-energised disconnecting the output design for slight delay before this disconnection any output for the AND gate would be significantly before the load threshold.

Figure 4:
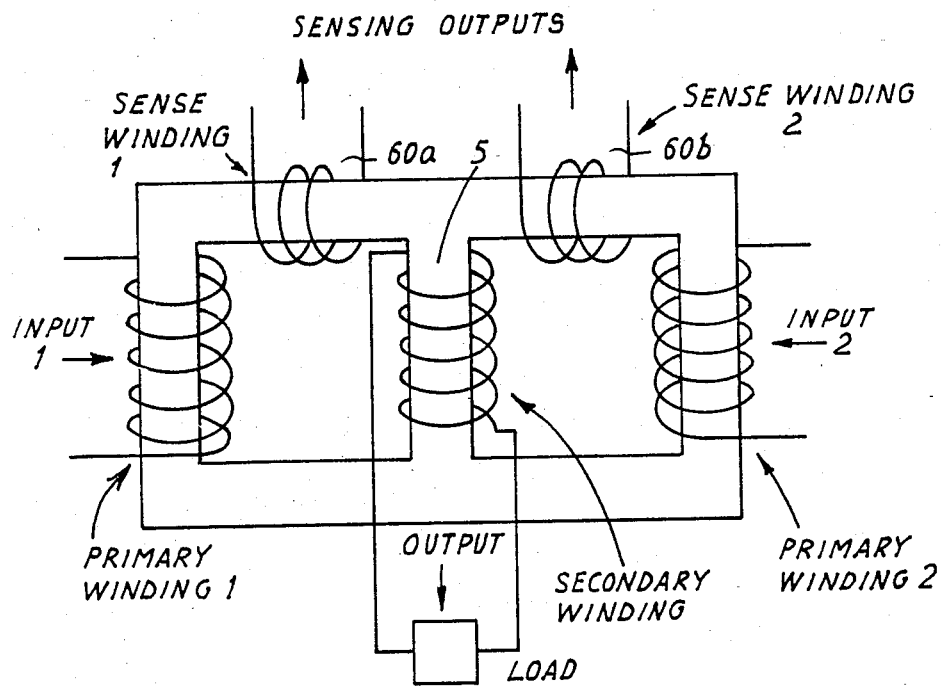
FIG. 4 shows schematically a variation of the transformer AND gate in which additional windings are provided for sensing test signals.

A modification to the transformer AND gate is shown in FIG. 4 in which additional sense windings 60a, 60b are provided for the purpose of continuously monitoring the performance of the magnetic circuit, and therefore of the whole gated output circuit including the multiplexer output circuits. These sensing windings 60a, 60b may also be used in conjunction with the subliminal test pulses for the purpose of detecting faults at the earliest opportunity so that appropriate action can be taken for example to shut-down the fail system, and to alert to the need for remedial action.

In a further variation of the circuit the winding 60a, 60b may be used for the purpose of test monitoring by periodic injection of a test signal into the magnetic circuit and observing its momentary effect of inducing voltages in the windings 7 and 9 of the device, this test signal may be pulsed or alternatively a continuous of frequency. In either correlation of the original test and sensed pulses is carried out in the housings 23a and 23b as shown in FIG. 2. In similar manner a sense or test winding may also be provided on the common limb of the transformer gate magnetic circuit.

In an alternative embodiment of the invention the transformer AND gate may be employed in a railway track circit arrangement, as an alternative to a double element vane relay. In such an arrangement an original A.C. signal is connected to one of the windings 7 or 9, and a signal taken from the track running rails is connected to the other winding of the pair, either input being provided via phase adjusting circuits as necessary to establish the connect phase relationship. The output produced across the terminals of winding 8 is therefore greatest when both signals are of substantially the same amplitude, frequency and in phase. This amplitude condition only exists when the track section is unoccupied. A significant reduction in the track signal input will result in a drop in output level from the AND gate which when less than the load threshold is taken to indicate that the track section being occupied. The frequency and phase properties of the AND gate ensre that potentially interfering signals, e.g. traction currents, do not cause false track circuit operation, providing of course that such signals are not of the same frequency and phase as the gate of A.C. supply frequency.

I claim:

1. A circuit for performing a logical AND function on a plurality of input signals comprising a magnetic core having a common limb, a plurality of further limbs arranged around the common limb to define a plurality of magnetic circuits, a plurality of imput windings each of which is coupled with a different one of said plurality of further limbs and each of which is connected through a switching means for energization by a source of alternating current, said input windings being connected in a manner to produce flux in the same direction in the common limb, an output winding coupled with the common limb and connected with a load, said load having means for setting an output threshold level, the common limb having a reluctance value which provides that in operation of the circuit there is at least about four times increase in the flux density in the common limb and there is induced in the output winding a signal greater than the threshold level as set by the output threshold level setting means when the input signals as generated by the energization of the input signals are coincident.

2. A circuit as claimed in claim 1 wherein the common limb has an air-gap.

3. A circuit as claimed in claim 1 wherein the magnetic circuit comprises three parallel limbs joined by end sections and all lying in a common plane.

4. A circuit as claimed in claim 3 wherein the magnetic circuit comprises a central common limb and a plurality of further parallel limbs connected with the central common limb by end sections disposed at angular intervals around the central common limb.

5. A circuit as claimed in claim 1 wherein the common limb winding is connected to supply a load having threshold discriminating means adapted so that a load will respond to an output produced in response to said output windings being energised simultaneously by A.C. signals substantially in phase and of the same sense.

6. A circuit as claimed in claim 1 included in a railway track circuit which comprises one or more track rails and an alternating electrical signal source coupled with one of said track rails at a first location, wherein one of said input windings is connected to said alternating electrical signal source and a second of said input windings is connected to the track rail to which said alternating electrical signal source is connected at a second location spaced apart from said first location along the length of said track rail, so that the output winding of said circuit of claim 20 provides a track circuit output signal indicative of a railway track circuit unoccupied between said first and second locations when said two input windings are energized and of a railway track circuit occupied between said first and second locations when said second input winding is de-energized.

7. A railway signal interlocking system comprising:
a circuit for performing a logical AND function of A.C. signals comprising a plurality of magnetic circuits disposed around a common limb, a first signal winding inductively coupled with said common limb and a plurality of further input signal windings, each of which is inductively coupled with one of said plurality of magnetic circuits such that the output induced in the first signal winding by flux through said common limb is significantly greater, relative to other conditions, when all of said plurality of further input signal windings are energized simultaneously by A.C. signals substantially in phase and of the same sense;

a plurality of parallel independent demultiplexers, each of which are connected to one of said plurality of further input signal windings, said independent demultiplexers receiving data from a signal interlocking processor; and wherein said first signal winding is connected to a signal interlocking output of said signal interlocking processor.

8. A circuit as claimed in claim 7 wherein said first signal winding is connected to supply each of a plurality of interlocking control signal outputs.

9. A circuit for performing a logical AND function of A.C. signals comprising a plurality of magnetic circuits disposed around a common limb, a first signal winding inductively coupled with the common limb and a plurality of further input signal windings, each of which is inductively coupled with one of said magnetic circuits such that an output induced in the first signal winding by flux through said common limb is significantly greater, relative to other conditions, when all of said plurality of further input signal windings are energized simultaneously by A.C. signals substantially in phase and of the same sense, wherein each of said plurality of further input signal windings is connected with an A.C. electrical supply means in series with one of a plurality of switching circuits, said switching circuits are controlled individually by input signals to which the AND function is to be applied, and wherein there is further provided a control and detection circuit path which includes one of said plurality of further input signal windings and which path includes a means for introducing one or more subliminal test pulses into said path and a subliminal test pulse sensing means responsive to the effects of said subliminal test pulses, and a means for correlating an output of said subliminal test pulse sensing means with said subliminal test pulses to determine the integrity of the control and detection circuit path.

10. A circuit as claimed in claim 9 wherein the means for introducing one or more subliminal test pulses comprises a switching circuit connected in parallel with a first input signal controlled switching circuit in each of said further input signal winding of said magnetic circuits.

11. A circuit as claimed in claim 10 wherein the subliminal test pulse sensing means comprises light emitting means responsive to current flow in said windings of said magnetic circuits and optically coupled with an input to said correlating means.

12. A circuit as claimed in claim 10 wherein the subliminal test pulse sensing means comprise a plurality of additional windings each inductively coupled with a magnetic circuit and connected with said correlating means.

13. A circuit as claimed in claim 9 wherein the subliminal test pulse sensing means comprises light emitting means responsive to current flow in said windings of said magnetic circuits and optically coupled with an input to said correlating means.

14. A circuit as claimed in claim 13 wherein the light emitting means comprises a light emitting device connected in parallel with diode means in series with the current flow in said wingings.

15. A circuit as claimed in claim 9 wherein the subliminal test pulse sensing means comprise a plurality of additional windings each inductively coupled with a magnetic circuit and connected with said correlating means.

* * * * *